(12) United States Patent  (10) Patent No.: US 7,359,823 B2
Forster  (45) Date of Patent: Apr. 15, 2008

(54) RFID DEVICE VARIABLE TEST SYSTEMS AND METHODS

(75) Inventor: Ian J. Forster, Chelmsford (GB)

(73) Assignee: Avery Dennison, Pasadena, CA (US)

( * ) Notice: Subject to any disclaimer, the term of this patent is extended or adjusted under 35 U.S.C. 154(b) by 0 days.

(21) Appl. No.: 11/137,224

(22) Filed: May 25, 2005

(65) Prior Publication Data

US 2006/0271328 A1 Nov. 30, 2006

(51) Int. Cl.
*G06F 19/00* (2006.01)
(52) U.S. Cl. ...................................................... 702/122
(58) Field of Classification Search ................ 702/122, 702/62, 182; 340/870.11
See application file for complete search history.

(56) References Cited

U.S. PATENT DOCUMENTS

| | | | |
|---|---|---|---|
| 4,802,216 A | 1/1989 | Irwin et al. | |
| 5,613,228 A | 3/1997 | Tuttle et al. | |
| 5,983,363 A | 11/1999 | Tuttle et al. | |
| 6,060,815 A * | 5/2000 | Nysen | 310/318 |
| 6,104,291 A * | 8/2000 | Beauvillier et al. | 340/572.1 |
| 6,219,543 B1 | 4/2001 | Myers et al. | |
| 6,236,223 B1 * | 5/2001 | Brady et al. | 324/765 |
| 6,246,326 B1 | 6/2001 | Wiklof et al. | |
| 6,346,881 B1 | 2/2002 | Davidson | |
| 6,409,401 B1 | 6/2002 | Petteruti et al. | |
| 6,412,086 B1 | 6/2002 | Friedman et al. | |
| 6,445,297 B1 | 9/2002 | Nicholson | |
| 6,486,769 B1 | 11/2002 | McLean | |
| 6,487,681 B1 | 11/2002 | Tuttle et al. | |
| 6,545,605 B2 | 4/2003 | Van Horn et al. | |
| 6,593,853 B1 | 7/2003 | Barrett et al. | |
| 6,784,789 B2 * | 8/2004 | Eroglu et al. | 340/10.6 |
| 6,806,812 B1 | 10/2004 | Cathey | |
| 6,938,200 B2 * | 8/2005 | Pax et al. | 714/798 |
| 7,132,946 B2 | 11/2006 | Waldner et al. | |
| 2001/0002106 A1 | 5/2001 | Tuttle et al. | |
| 2002/0167397 A1 | 11/2002 | Kursat et al. | |
| 2002/0186004 A1 | 12/2002 | Prazeres da Costa | |

(Continued)

FOREIGN PATENT DOCUMENTS

JP 2003/076946 3/2003

(Continued)

OTHER PUBLICATIONS

Merriam-Webster's online dictionary, Retrieved from the Internet: <URL:http://www.m-w.com/dictionary/step> [retrieved on Jul. 26. 2006], pp. 2.*

(Continued)

*Primary Examiner*—Tung S Lau
(74) *Attorney, Agent, or Firm*—MacPherson Kwok Chen & Heid LLP; Greg J. Michelson (57) ABSTRACT

Systems and methods are disclosed herein to provide variable test techniques for RFID devices. For example, in accordance with an embodiment of the present invention, a radio frequency identification (RFID) test system includes an RFID reader adapted to provide an RF signal to an RFID device, wherein a signal level of the RF signal changes as the RFID device moves through a test region. The performance level of the RFID device is determined based upon the number of times the RFID device responds to the RF signal.

27 Claims, 3 Drawing Sheets

U.S. PATENT DOCUMENTS

| | | |
|---|---|---|
| 2004/0032443 A1 | 2/2004 | Moylan et al. |
| 2004/0075607 A1 | 4/2004 | Cathey |
| 2004/0178267 A1 | 9/2004 | Tsirline et al. |
| 2004/0215350 A1 | 10/2004 | Roesner |
| 2005/0045723 A1 | 3/2005 | Tsirline et al. |
| 2005/0045724 A1 | 3/2005 | Tsirline et al. |
| 2005/0068179 A1 | 3/2005 | Roesner |
| 2005/0150102 A1 | 7/2005 | Bosco et al. |
| 2006/0012387 A1 | 1/2006 | Shanks |
| 2006/0145710 A1* | 7/2006 | Puleston et al. ............ 324/750 |
| 2006/0197652 A1* | 9/2006 | Hild et al. ................. 340/10.2 |

FOREIGN PATENT DOCUMENTS

| | | |
|---|---|---|
| JP | 2003/076947 | 3/2003 |
| JP | 2003/099719 | 4/2003 |
| JP | 2003/099720 | 4/2003 |
| JP | 2003/099721 | 4/2003 |
| JP | 2003/168082 | 6/2003 |
| JP | 2003/168098 | 6/2003 |
| JP | 2003/187213 | 7/2003 |
| JP | 2003/331220 | 11/2003 |
| WO | WO 00/28339 | 5/2000 |
| WO | WO 01/65517 | 9/2001 |
| WO | WO 02/14884 | 2/2002 |
| WO | WO 02/88762 | 11/2002 |
| WO | WO 2004/084119 | 9/2004 |
| WO | WO 2004/088571 | 10/2004 |
| WO | WO 2004/095350 | 11/2004 |

OTHER PUBLICATIONS http://www.m-w.com/cgi-bin/dictionary?va=transmission, p. 1.*
http://www.m-w.com/dictionary/test, p. 1.*
http://www.m-w.com/dictionary/line, p. 1-3.*

* cited by examiner

FIG. 9

RFID DEVICE VARIABLE TEST SYSTEMS AND METHODS

TECHNICAL FIELD

The present invention relates generally to radio frequency identification (RFID) devices and applications and, more particularly, to RFID device testing.

BACKGROUND

Radio frequency identification (RFID) devices are manufactured in many different types of configurations (e.g., RFID tags, RFID labels, RFID chips, RFID straps, or RFID inlays) and are increasingly utilized in a wide variety of applications. However, one challenge associated with RFID devices is the manufacture and testing of the RFID devices in a high-volume and cost-effective manner.

For example, during or after the manufacturing process, the RFID devices may be tested while located in close proximity to each other (e.g., adjacent RFID devices closely spaced). The RFID devices, for example, may be manufactured on a common carrier web (e.g., a sheet or a roll-to-roll format), with each RFID device (e.g., an RFID inlay) having its antenna mounted on the common carrier web and its integrated circuit mounted to the antenna. However, conventional techniques of positioning each RFID device individually at a designated static test position during the test period tends to slow production and add significantly to the manufacturing costs.

Alternatively, the RFID devices may be tested, for example, after being separated from the common carrier web. However, handling and positioning each RFID device individually within the designated static test position also tends to add to the manufacturing costs and to the amount of time required to test each RFID device. As a result, there is a need for improved test techniques for RFID devices.

SUMMARY

Systems and methods are disclosed herein to provide variable test techniques for RFID devices. For example, in accordance with an embodiment of the present invention, an RFID test system is disclosed that tests each RFID device by varying one or more test parameters as the RFID device travels through the test area. For example, the strength of the radio frequency field may vary as a function of the position of the RFID device as it travels through the test area. Furthermore, in accordance with an embodiment of the present invention, the number of times the RFID device responds while traveling through the test area may be utilized to determine the RFID device's performance.

In accordance with one embodiment of the present invention, a radio frequency identification (RFID) test system includes an RFID reader adapted to provide an RF signal to an RFID device, wherein a signal level of the RF signal changes as the RFID device moves through a test region; and wherein a performance level of the RFID device is determined based upon the number of times the RFID device responds to the RF signal.

In accordance with another embodiment of the present invention, a radio frequency identification (RFID) communication system includes means for providing an RF signal for one or more RFID devices; means for varying a parameter of the RF signal provided to the one or more RFID devices as the one or more RFID devices travel through a test region; and wherein a corresponding performance level for the one or more RFID devices is determined based upon the corresponding number of times the one or more RFID devices respond to the RF signal.

In accordance with another embodiment of the present invention, a method of testing radio frequency identification (RFID) devices includes providing an RF signal for one or more RFID devices; varying a parameter of the RF signal provided to the one or more RFID devices as the one or more RFID devices travel through a test region; and determining a corresponding performance level for the one or more RFID devices based upon the number of times the corresponding one or more RFID devices respond to the RF signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
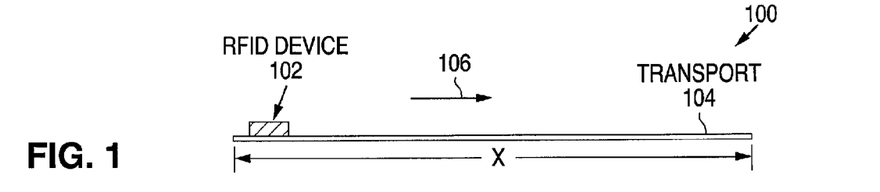
FIG. 1 shows a block diagram illustrating an RFID device test system and method in accordance with an embodiment of the present invention.

FIG. 1 shows a block diagram of a test system 100 illustrating RFID device test techniques in accordance with an embodiment of the present invention. Test system 100 illustrates techniques for measuring the performance of an RFID device 102 (e.g., an RFID tag, an RFID label, an RFID chip, an RFID strap, or an RFID inlay) as it travels through the manufacturing or testing process. RFID device 102 may be a separate device and/or may be in close proximity to one or more other RFID devices 102 (e.g., as part of a common carrier web in a sheet or roll format). By utilizing the techniques disclosed herein, one or more RFID devices 102 may be tested while moving, which may greatly reduce the test time and may minimize the complexity of the conventional test setup and manufacturing process.

For example, RFID device 102 may be transported by an element 104, which may represent a conventional transport mechanism for RFID device 102 and/or may represent a common carrier web (e.g., a sheet or a roll format) that includes one or more RFID devices 102. As shown in FIG. 1, RFID device 102 moves through a test region (e.g., as defined by "X" in the direction of an arrow 106), where a test parameter (e.g., the field strength of the radio frequency (RF) signal) is varied as a function of the position of RFID device 102 in the test region.

RFID device 102, depending upon the type of RFID device 102 and its specific performance parameters, will be able to respond to the RF signal (e.g., from an RFID reader) when RFID device 102 reaches an area within the test region where the test parameter (e.g., the RF signal's field strength) is equal to or above a minimum level or threshold. Although the RF signal's field strength (i.e., signal level) is provided as an example, it should be understood that other parameters of the RF signal may be varied (e.g., antenna gain, transmitted power, or impedance matching factor) to test the RFID device, as discussed further herein, in accordance with the principles of the present invention.

In accordance with an embodiment of the present invention, one technique for determining the performance of RFID device 102 is based upon the number of times RFID device 102 responds to the RF signal in the test region. For example, if RFID device 102 moves through the test region at a certain speed, then, on average, the number of times RFID device 102 can respond (e.g., transmit its ID) to the RFID reader is a function of the time RFID device 102 spends in an RF field strength equal to or above its RF field strength threshold. Therefore, the number of times RFID device 102 responds as it moves through the test region is related to the RF field strength threshold of RFID device 102, which can be related to or correspond to the performance of RFID device 102.

Figure 2:
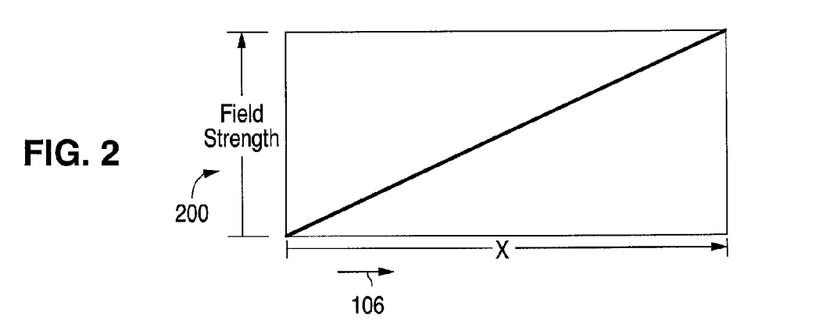
FIG. 2 shows a graph illustrating an RFID device test technique in accordance with an embodiment of the present invention.

For example, FIG. 2 shows a graph 200 illustrating an exemplary RF field strength plot for the test region in accordance with an embodiment of the present invention. As shown, the RF field strength (Field Strength or FS) increases as RFID device 102 travels through the test region (X) in the direction of arrow 106 (i.e., the RF field strength is a function of X or position within the test region). Thus, the RF field strength (FS) may be represented in equation form as $FS=f(X)$.

Figure 3:
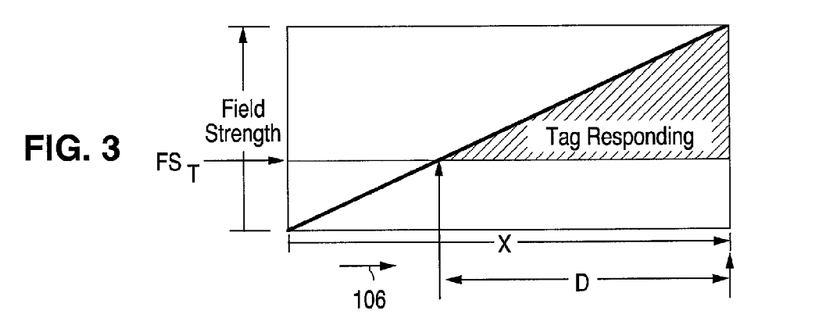
FIG. 3 shows a graph illustrating an RFID device test technique in accordance with an embodiment of the present invention.

RFID device 102, depending upon the type of RFID device 102 and its performance parameters, will generally begin to respond to the RF signal (i.e., command) when the RF field strength reaches a certain RF field strength threshold level ($FS_T$). For example, FIG. 3 shows a graph 300 illustrating an exemplary RF field strength threshold level ($FS_T$) within the test region X in accordance with an embodiment of the present invention.

As an example, the portion of the test region (X), which is at or above the RF field strength threshold level ($FS_T$) generally required for RFID device 102 to respond is identified as a distance "D" in graph 300. Thus, RFID device 102 will respond to the RFID reader (or other type of communication device issuing commands to RFID device 102) one or more times while traveling a distance "D" through the test region.

If RFID device 102 travels at a velocity "V" through the test region over the distance "D", the response period ($T_R$) may be represented in equation form as $T_R=D/V$. Furthermore, if on average RFID device 102 responds to the RF signal (e.g., the command from the RFID reader) to provide a certain number of reads per second, referred to herein as K reads/second, then the number of reads (R) may be represented in equation form as $R=(T_R)(K)$.

Therefore, as the variables are linearly related, it follows that the number of reads (R) is a function of the RF field strength threshold ($FS_T$) for RFID device 102 (i.e., $R=f(FS_T)$) and may be utilized as a measure of performance. Consequently, for example, by transitioning RFID device 102 through an RF field strength profile and counting the number of times RFID device 102 is read, an analog measurement of the performance of RFID device 102 may be obtained.

It should be understood, however, that although the RF field strength is shown as linearly increasing, this is not limiting and the RF field strength may vary in a non-linear fashion through the test region. For example, in accordance with an embodiment of the present invention, the RF field strength profile may be formed as one or more curves or a combination of linear slopes and curves. It should also be understood that the path of RFID devices 102 (e.g., the common carrier web) across the test region or test aperture does not need to be a linear progression. For example, the path may include a curved path (e.g., with the common carrier web hanging between two rollers towards a short-range coupler and/or a long-range antenna) to provide a different RF field strength profile to be achieved. Thus, by adjusting the RF field strength profile to include one or more non-linear portions, a greater degree of resolution over critical points of the RF field strength profile (e.g., threshold distribution) may be provided for RFID device 102 (e.g., depending upon the type and performance of RFID device 102).

As an example, if RFID devices 102 respond well above a certain RF field strength level (e.g., a first threshold), except for the RFID devices 102 that are completely defective, then the RF field strength profile may be adjusted to provide greater resolution below or around this first threshold. For example, the majority of the length and/or time within the test region may be utilized to test at RF field strength levels from a certain minimum level below the first threshold to a certain RF field strength level above the first threshold. Furthermore, the RF field strength levels may also be set or stepped (e.g., through one or more plateaus) or varied appropriately within one or more regions of the test region to provide testing for pass/fail threshold determinations or for other test parameter determinations.

The techniques disclosed herein may be applied to one RFID device 102 moving through the RF field strength profile or to any number of RFID devices 102. For example, if the RFID reader system can count the responses from more than one RFID device 102 simultaneously, then RFID reader system can determine the performance for a roll of closely spaced RFID devices 102, with the number of reads for each RFID device 102 representing its quality or performance level.

For example, each RFID device 102 may have a unique ID or be programmed with a unique ID prior to being tested using the test techniques disclosed herein. Consequently, the RFID reader system would be able to distinguish the responses from RFID devices 102 and determine the performance level for each RFID device 102. Furthermore, the determined performance levels for RFID devices 102 may be determined at least partially based upon the RFID reader system's capabilities and various other performance parameters.

For example, depending upon the number of RFID devices 102 and the RFID reader system's capabilities, the performance level thresholds (e.g., minimum acceptable performance levels or test thresholds) may be adjusted to compensate for interactions between RFID devices 102. The performance level thresholds may also be adjusted to allow for compensation due to interactions between RFID devices 102. For example, a defective RFID device 102 may affect the performance of a neighboring non-defective RFID device 102. To account for this effect, the performance level threshold (e.g., pass/fail threshold for number of reads) may be decreased (e.g., adaptively set or variable threshold) for the non-defective RFID device 102. Further information regarding variable thresholds and interactions among RFID devices may be found in U.S. patent application Ser. No. 11/101,352 entitled "RFID Device Test Thresholds Systems and Methods" and filed Apr. 7, 2005, which is incorporated herein by reference in its entirety.

The RF signal having a variable field strength profile, in accordance with one or more embodiments of the present invention, may be provided to one or more RFID devices 102 moving through the test region by utilizing short-range techniques (e.g., near field coupling) and/or long-range techniques (e.g., far field transmission utilizing a radiating electromagnetic field). In general, an antenna of RFID device 102 may be viewed as having a near field region and a far field region. The near field region refers to a reactive near field (e.g., approximately $R \leq \lambda/2\pi$) and a radiating near field (e.g., approximately $R < 2D^2/\lambda$), while the far field region refers to a radiating far-field component (e.g., approximately $R > 2D^2/\lambda$), where R is the distance from the antenna and D is the largest dimension of the antenna. Thus, short-range communication generally involves the reactive near field, radiating near field, radiating far field, and/or a direct electrical connection, while long-range communication generally involves the radiating far field.

Figure 4:
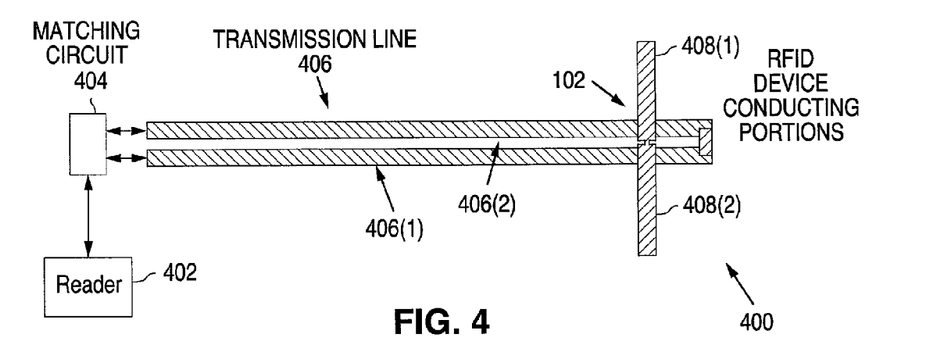
FIG. 4 shows a block diagram illustrating an RFID device test system and method in accordance with an embodiment of the present invention.

For example, FIG. 4 shows a block diagram of a test system 400 illustrating short-range test techniques for one or more RFID devices 102 in accordance with an embodiment of the present invention. Test system 400 includes an RFID reader 402 and a transmission line 406. RFID reader 402 represents any type of conventional source for providing the RF signal to RFID device 102.

Transmission line 406 may represent a transmission line pair (e.g., as illustrated in FIG. 4 and separately referenced as transmission lines 406(1) and 406(2)) or any other type of wired transmission line structure, parallel conductor strip (e.g., with a defined separation), and/or short-range coupling structure (e.g., near field coupling structure). For example, transmission line 406 may be implemented as a microstrip, a coplanar waveguide, or a coplanar waveguide with a ground and a twin line.

RFID reader 402 provides the RF signal to RFID device 102 via transmission line 406. A circuit 404, which represents a balanced drive and impedance matching circuit, may also be provided to appropriately couple RFID reader 402 to transmission line 406. Circuit 404, for example, may be incorporated within or formed as part of RFID reader 402. As shown in FIG. 4, RFID device 102 is implemented in an exemplary fashion as having two conducting portions 408(1) and 408(2) for coupling with transmission line 406 via an electric field, a magnetic field, some combination of electric and magnetic fields, or via a direct electrical connection. For example, conducting portions 408(1) and 408(2) may represent an antenna (e.g., a dipole type antenna), a strap/interposer, conductive leads, or chip pads of RFID device 102.

Depending upon conducting portions 408(1) and 408(2), the appropriate coupling device or type of transmission line 406 may be selected as would be understood by one skilled in the art. For example, transmission line 406 may be implemented as parallel transmission lines to couple with an antenna (conducting portions 408(1) and 408(2)) of RFID device 102.

The RF signal provided by RFID reader 402 may be provided as a variable RF field strength profile by transmission line 406, in accordance with an embodiment of the present invention, by utilizing various techniques. For example, if the coupling between transmission line 406 and RFID device 102 is primarily an electric field (e.g., a capacitive coupling between transmission line 406 and RFID device 102), then the RF field strength profile along transmission line structure may be provided based upon one or more factors (e.g., based on distance, dielectric constant, capacitive area, and/or lossy line).

Figure 6:
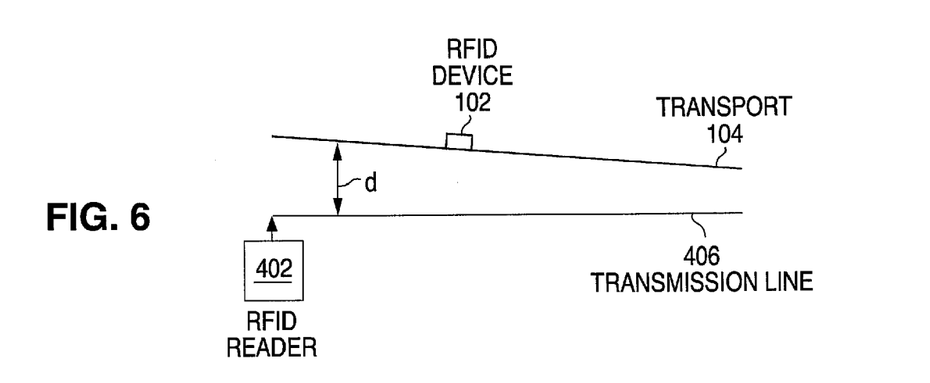
FIG. 6 shows a block diagram illustrating an RFID device test system and method in accordance with an embodiment of the present invention.

As an example, one factor that may be varied is a distance "d" between transmission line 406 and RFID devices 102 being tested (e.g., the common web of RFID devices 102). For example, referring briefly to FIG. 6, transmission line 406 may have a linear slope (or some other path that varies) relative to the route (e.g., of element 104) traveled by RFID devices 102 while traveling through the test region. As an exemplary implementation example, the initial spacing or distance (d) may be 10 mm between transmission line 406 and RFID device 102 at the start of the test region, with the distance (d) gradually reduced to 2 mm while RFID device 102 travels through the test region (e.g., the test region being 1 meter in length). Thus, the RF field strength is varied by providing approximately a 5:1 variation in the distance (d), which varies the capacitance between transmission line 406 and RFID device 102 as RFID device 102 travels through the test region.

Figure 7:
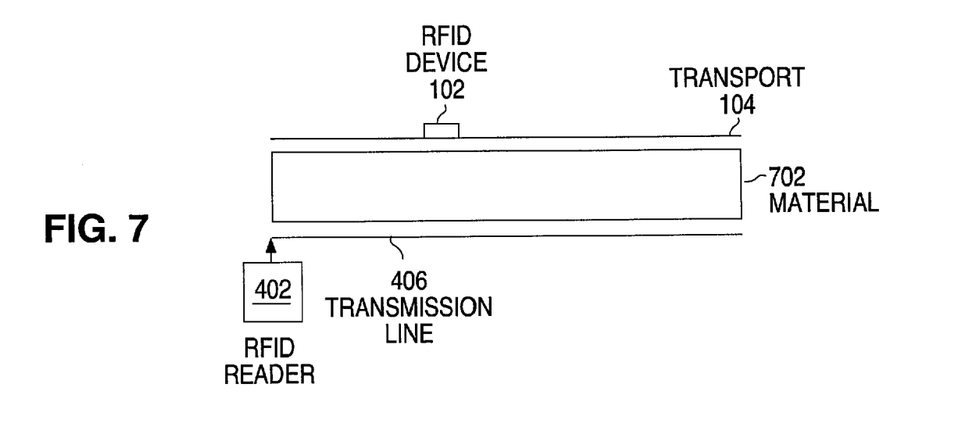
FIG. 7 shows a block diagram illustrating an RFID device test system and method in accordance with an embodiment of the present invention.

As another example, referring briefly to FIG. 7, a dielectric constant (k) of a material 702 may be varied between transmission line 406 and RFID device 102 as it travels through the test region. For example, a constant separation between transmission line 406 and RFID device 102 may be maintained while gradually varying the dielectric constant (k) of material 702 between transmission line 406 and RFID device 102 as RFID device 102 travels through the test region. As a specific implementation example, dielectric constant (k) of material 702 may be varied from two (e.g., a pure plastic such as polyethylene) to ten (e.g., a plastic loaded with a high dielectric constant powder), while maintaining a 2 mm separation between transmission line 406 and RFID device 102 as RFID device 102 travels through the test region. Thus, the RF field strength (or RF signal strength) is varied by providing approximately a 5:1 variation in the dielectric constant (k), which varies the capacitance between transmission line 406 and RFID device 102 as RFID device 102 travels through the test region.

As another example, the area of transmission line 406 may be varied as RFID device 102 travels through the test region. For example, the parallel area of transmission line 406 may be varied by varying the width and/or gap of the two conductor elements (i.e., transmission lines 406(1) and 406(2)) forming transmission line 406, while maintaining an approximately constant impedance. Thus, the RF field strength and hence the mutual capacitance between transmission line 406 and RFID device 102 is varied by varying the area of transmission line 406 through the test region.

As another example, transmission line 406 may be provided having a relatively high loss. As a specific implementation example, transmission line 406 may be provided as a high loss line to attenuate the RF signal (e.g., 10 dB) through the test region. Thus, the voltage and hence the RF field strength provided by transmission line 406 may be provided as a function of distance, for example, with the highest RF field strength level at the point where the line is driven (e.g., by RFID reader 402) and the lowest RF field strength level at the termination point. Note that RFID reader 402 may be configured at either end of transmission line 406 to provide the desired RF field strength profile at the beginning and end of the test region.

It should be understood that these various factors for varying the RF field strength are exemplary and may be utilized separately or in any combination, as desired and depending upon the implementation requirements. Furthermore, additional techniques may be utilized alone or in combination with the techniques discussed herein. For example, transmission line 406 may be implemented as a number of short-range couplers arranged along the test region and being driven at one or more different levels to create the RF field strength profile (e.g., a stepped RF field profile) for RFID device 102 within the test region.

Figure 8:
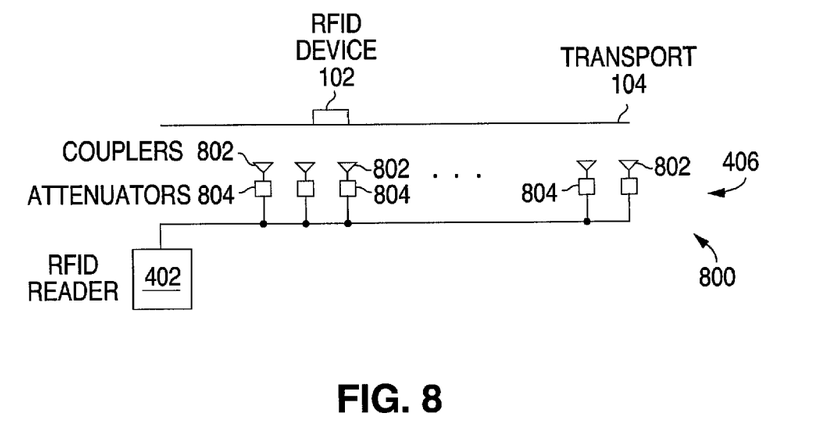
FIG. 8 shows a block diagram illustrating an RFID device test system and method in accordance with an embodiment of the present invention.

For example, referring briefly to FIG. 8 in accordance with an embodiment of the present invention, a block diagram of a test system 800 shows RFID reader 402 providing the RF signal to transmission line 406, which includes a number of short-range couplers 802. Transmission line 406 may further include a number of attenuators 804 (e.g., providing varying levels of attenuation) that appropriately attenuate the RF signal to provide the desired RF field strength profile for RFID devices 102 traveling through the test region.

Various conventional short-range coupling techniques are known and may be utilized to provide the RF signal from one or more RFID readers 402 to RFID device 102, as would be known by one skilled in the art. Furthermore, the RF signal from one or more RFID readers 402 to RFID device 102 via short-range couplers may be implemented as disclosed in U.S. patent application Ser. No. 10/367,515, filed Feb. 13, 2003, and entitled "RFID Device Tester and Method" and/or as disclosed in U.S. patent application Ser. No. 10/882,947, filed Jul. 1, 2004, and entitled "RFID Device Preparation System and Method," which are incorporated herein by reference in their entirety.

The short-range couplers may couple via an electric field with RFID device 102 (e.g., in a capacitive fashion). Alternatively, or in addition, the short-range couplers may couple via a magnetic field by utilizing a coil (e.g., single-turn coil or multi-turn coil) to couple with RFID device 102 (e.g., in an inductive fashion). Thus, the short-range couplers may couple to RFID device 102 via an electric field, a magnetic field, or some combination of electric and magnetic fields (electromagnetic field), with the short-range couplers providing the appropriate structure (e.g., parallel plates, single or multi-turn coils, transmission lines, or other types of structures). Furthermore, the signal frequency provided to RFID device 102 may be at a frequency different from the natural resonant frequency of RFID device 102, as discussed further in U.S. patent application Ser. Nos. 10/367,515 and 10/882,947.

Alternatively, the short-range couplers may provide short-range coupling by making a direct connection with one or more conducting contact points of RFID device 102, as would be understood by one skilled in the art. For example, the short-range couplers may make a direct connection with the antenna, the strap/interposer (e.g., conducting leads of the RFID device), or chip pads of RFID device 102, depending upon the type of RFID device being utilized. Thus, the short-range couplers may provide short-range coupling in the near field via electric and/or magnetic fields or by direct connection with RFID device 102.

Figure 5:
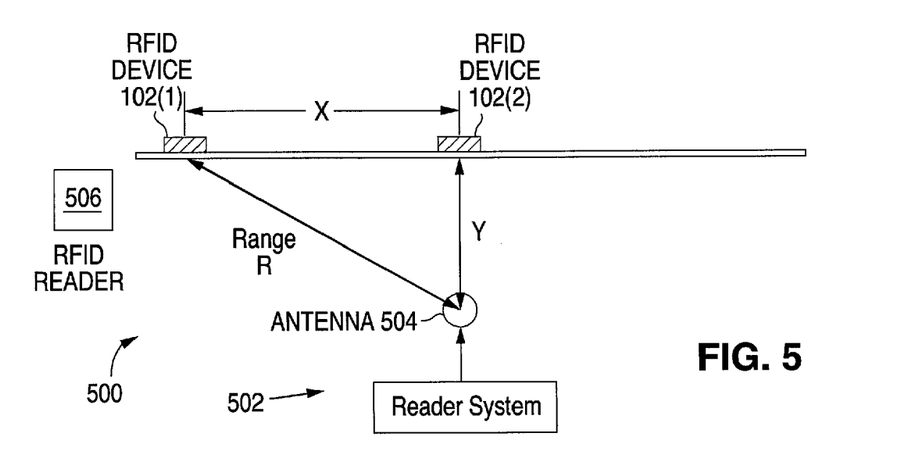
FIG. 5 shows a block diagram illustrating an RFID device test system and method in accordance with an embodiment of the present invention.

As discussed above, the RF signal may also be provided as a variable field strength profile by utilizing long-range techniques. For example, FIG. 5 shows a block diagram of a test system 500 illustrating long-range test techniques for one or more RFID devices 102 in accordance with an embodiment of the present invention. Test system 500 includes an exemplary far-field implementation of an RFID reader system 502 for providing the RF signal to one or more RFID devices 102 being tested.

For example, RFID reader system 502 may be situated to provide the RF signal via far-field propagation paths, with the RF field strength profile a function of the distance (e.g., across the aperture of RFID reader system 502). As a specific implementation example as shown in FIG. 5, the range (R) and the propagation loss (L) of the RF signal in free space may be described as shown below in equations (1) and (2), respectively.

$$R = \sqrt{X^2 + Y^2} \tag{1}$$

$$L \text{ (dB)} = 20\log_{10}\frac{\lambda}{4\pi R} \tag{2}$$

As RFID device 102 progresses from one end of the test region (e.g., a test position $-X_{max}$ with RFID device 102(1) located at this test position) to the other end of the test region (e.g., a test position $X_0$ with RFID device 102(2) located at this test position), the range (R) and, consequently, the RF propagation loss (L) will vary.

For example, if the range (R) was equal to 4 Y at test position $-X_{max}$, the propagation loss (L) may vary by approximately 12 dB as RFID device 102 transitions through the test region. This is based on the assumption that an antenna 504 (e.g., under the common carrier web) of RFID reader system 502 has an equal radiation pattern in all directions (e.g., in the direction of the test region). For example, antenna 504 may represent a dipole antenna, which has nulls at its endpoints, but provides approximately a uniform radiation pattern over 360 degrees around its central region.

However, test system 500 is not limited to any particular type of antenna, which may be selected as would be understood by one skilled in the art based upon the desired radiation pattern. For example, the antenna may be selected to provide a certain radiation pattern or RF field strength profile. As an example, a number of different types of antennas (e.g., a patch antenna or a yagi antenna) have radiation patterns that change with angle. Therefore, RFID device 102(1) (at test position $-X_{max}$) may receive a reduced RF field strength relative to the location of RFID device 102(2) due not only to the change in range (R) from antenna 504 but also due to the change in the angle from antenna 504. Furthermore, RFID device 102 may also have an angular-dependent response, which may reduce the effective RF field strength at a certain test position (e.g., at $-X_{max}$).

Additional techniques may be implemented in addition to or as an alternative to the techniques discussed above to vary the RF field strength profile. For example, antenna 504 may represent a multiple antenna system, with each antenna having a certain phase and/or amplitude relationship. As another example, absorbing materials may be utilized to vary the RF field strength profile within test system 500.

In general for the short-range test systems and the long-range test systems, in accordance with one or more embodiments of the present invention, one or more RFID devices 102 may be simultaneously tested by counting the number of times they are read while moving through the test region (e.g., crossing the aperture of the test system). Furthermore, the techniques disclosed herein, in accordance with one or more embodiments of the present invention, may be utilized to test writing performance by using selective addressing methods. For example, to identify exactly which RFID device 102 is in which position within the test region (e.g., within the common carrier web), one or more short-range RFID readers 506 (e.g., utilizing a near-field coupler) as shown in FIG. 5 may be employed to perform a proximity read of RFID devices 102 to obtain their ID and corresponding position. The ID of RFID device 102 may also be obtained after the first received response, which provides the ID of RFID device 102 and allows a subsequent write command.

Figure 9:
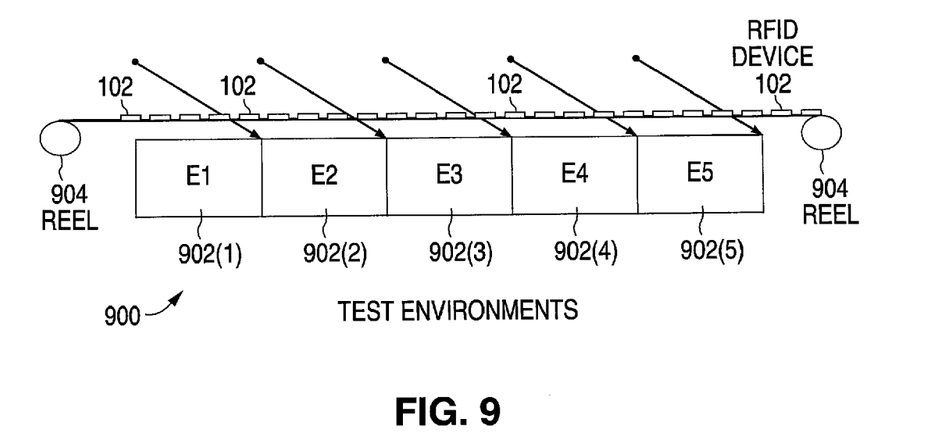
FIG. 9 shows a block diagram illustrating an RFID device test system and method in accordance with an embodiment of the present invention.

In accordance with one or more embodiments of the present invention, the techniques may be utilized to provide one or more series of tests. For example, FIG. 9 shows a block diagram of a test system 900 illustrating RFID device test techniques in accordance with an embodiment of the present invention. Test system 900 includes one or more test environments 902 (e.g., test environments 902(1) through 902(5)).

As an example, one or more RFID devices 102 (e.g., a web of RFID devices 102 traveling between spindles or reels 904, such as an unwind reel and a take-u reel) travel through a sequential series of test environments 902(1) through 902(5). Each test environment 902 may have one or more test parameters varied, such as for example RF field strength profiles (or "ramps"), frequency, or other characteristics.

For example, the nature of the RF field may vary from one test environment 902 to the next (e.g., test environment 902(1) to 902(2))), such as in terms of its transmission type via electric, magnetic, or electromagnetic fields. As another example, if RFID device 102 has a certain three-dimensional radiation pattern, then the direction of the RF signal provided to RFID device 102 may be varied. Therefore, the RF signal level received may be a function of an angular parameter to determine a relative RF field strength threshold for one or more angles and the number of reads at the one or more angles.

As another example, the frequency of the RF signal may be varied or stepped from one test environment 902 to the next or within one test environment 902. For example, the frequency of the RF signal provided to RFID device 102 for the RF field strength profile may have a first frequency (F1), with the RF field strength profile repeated for one or more additional frequencies. The result would be a series of corresponding counts (i.e., the number of reads) at the various frequencies, which may be used (e.g., mathematically processed by an algorithm) to determine the performance of RFID device 102. For example, the counts may be weighted based on desired properties, such as applying a greater weight (e.g., by a factor of two) to the performance at the higher frequencies than to the lower frequencies (e.g., for RFID devices designed for dielectric loads). Thus, for this example, performance at the higher frequencies would be given a greater value in the determination of the performance of RFID device 102.

One or more of test environments 902 may also provide simulations of product applications, such as for example for different dielectric materials and/or metallic materials similar to that of a potential product application. Thus, each test environment 902 may simulate an expected product environment (e.g., conductive/dielectric environment) to determine the performance of RFID device 102 for a given application. For each test environment 902, the RF field strength and/or other parameter (e.g., frequency and/or RF signal direction) may be varied to provide one or more tests or sequences to determine performance. The results may be weighted, if necessary as discussed, for the performance determination of RFID device 102. Consequently, by counting the reads in each test environment 902 as RFID device 102 travels through test system 900, a performance indication may be obtained for RFID device 102 for different product types or product applications and conditions.

As a specific example, one or more test environments 902 may be utilized to simulate the environment or conditions of an RFID enabled printer (e.g., RFID thermal printer) performing a programming or read operation of RFID device 102. The test may simulate the dielectric/conductive environment of the RFID printer and vary one or more parameters (e.g., RF field strength, RF signal direction, and/or frequency), with the performance in the RFID printer environment determined by counting the number of reads within test system 900. Consequently, the performance of RFID device 102 within an RFID printer or label applicator may be determined.

In general, test system 900 may be implemented to provide test conditions or various testing to one or more RFID devices 102. The number of times RFID device 102 is read will be counted for each test environment 902. Depending upon the conditions or test parameters varied for each test environment 902, the corresponding counts for test environments 902 may be evaluated using an algorithm that applies the appropriate weighting factor for each test environment 902 to compare to a threshold or other measurement parameter to determine the relative performance (or pass/fail condition) of RFID device 102.

Systems and methods are disclosed herein to provide variable test techniques for RFID devices. For example, in accordance with an embodiment of the present invention, an RFID test system is disclosed that tests each RFID device by varying one or more test parameters as the RFID device travels through the test area. As a specific implementation example, in accordance with an embodiment of the present invention, a ramp tester is disclosed that varies an RF field strength profile as RFID devices (e.g., RFID tags arranged in a sheet or roll format) move through a test region (e.g., across a test aperture) to perform an analog performance test. The analog performance test method, for example, provides a value indicating the performance level of the RFID device under test rather than simply a pass/fail test. For example, RFID devices 102 travel through a shaped RF field strength profile and have their performance determined (e.g., performance threshold) based on the number of times RFID devices 102 respond to an RFID reader within the test region.

Embodiments described above illustrate but do not limit the invention. It should also be understood that numerous modifications and variations are possible in accordance with the principles of the present invention. Accordingly, the scope of the invention is defined only by the following claims.

I claim:

1. A radio frequency identification (RFID) test system comprising:
   an RFID reader adapted to provide an RF signal to an RFID device, wherein a signal level of the RF signal changes as the RFID device moves through a test region; and
   wherein a performance level of the RFID device is determined based upon a total count of a plurality of responses of the RFID device to the RF signal from the RFID reader as the RFID device moves through the test region.

2. The RFID test system of claim 1, further comprising a transmission line, wherein the RFID reader provides the RF signal to the RFID device via the transmission line.

3. The RFID test system of claim 1, further comprising a plurality of short-range couplers, wherein the RFID reader provides the RF signal to the RFID device via the short-range couplers.

4. The RFID test system of claim 1, further comprising an antenna, wherein the RFID reader provides the RF signal to the RFID device via the antenna, with the signal level of the RF signal provided to the RFID device changing due to at least one of a change in distance between the RFID device and the antenna and a radiation pattern of the antenna.

5. The RFID test system of claim 1, wherein the signal level of the RF signal provided to the RFID device changes in at least one of a linear manner, a non-linear manner, and a stepped manner.

6. The RFID test system of claim 1, further comprising a plurality of RFID devices, wherein the RFID devices are arranged on a common carrier web and the performance level of the RFID devices are determined based upon the number of times the RFID devices respond to the RF signal.

7. The RFID test system of claim 1, wherein the test region comprises a plurality of test environments, with at least one of a frequency of the RF signal, a direction of the RF signal, and a transmission type of the RF signal varied for at least one of the test environments.

8. The RFID test system of claim 2, wherein the signal level of the RF signal provided to the RFID device is changed as it moves through the test region by varying a distance between the transmission line and the RFID device.

9. The RFID test system of claim 2, further comprising a first element disposed between the transmission line and the RFID device, wherein the signal level of the RF signal provided to the RFID device is changed as it moves through the test region by varying a dielectric constant of the first element.

10. The RFID test system of claim 2, wherein the signal level of the RF signal provided to the RFID device is changed as it moves through the test region due to at least one of attenuation of the RF signal as it propagates through the transmission line and variation of a surface area of the transmission line.

11. The RFID test system of claim 3, further comprising a plurality of attenuators adapted to attenuate the RF signal to form an RF field strength profile provided to the RFID device via the short-range couplers.

12. The RFID test system of claim 3, wherein the short-range couplers provide the RF signal to the RFID device in a near field region by at least one of an electric field, a magnetic field, and a direct electrical connection.

13. The RFID test system of claim 7, wherein the number of times the RFID device responds to the RF signal in each of the test environments determines the performance level of the RFID device.

14. A radio frequency identification (RFID) communication system comprising:
   means for providing an RF signal for one or more RFID devices;
   means for varying a parameter of the RF signal provided to the one or more RFID devices as the one or more RFID devices travel through a test region; and
   wherein a corresponding performance level for the one or more RFID devices is determined based upon a corresponding total count of a plurality of responses of the corresponding one or more RFID devices to the RF signal as the RFID devices move through the test region.

15. The RFID test system of claim 14, wherein the parameter comprises at least one of a field strength, a direction, a transmission type, and a frequency of the RF signal.

16. The RFID test system of claim 14, wherein the test region comprises a plurality of test environments.

17. The RFID test system of claim 14, wherein the RFID devices comprise at least one of RFID tags, RFID labels, RFID chips, RFID straps, and RFID inlays.

18. The RFID test system of claim 14, wherein the varying means provides the RF signal to the one or more RFID devices in a near field region by at least one of an electric field, a magnetic field, and a direct electrical connection.

19. The RFID test system of claim 14, wherein the parameter of the RF signal provided to the one or more RFID devices varies in at least one of a linear manner, a non-linear manner, and a stepped manner.

20. The RFID test system of claim 16, wherein the number of times the one or more RFID devices respond to the RF signal in each of the test environments is weighted to determine the performance level for the one or more RFID devices.

21. A method of testing radio frequency identification (RFID) devices, the method comprising:
   providing an RF signal for one or more RFID devices;
   varying a parameter of the RF signal provided to the one or more RFID devices as the one or more RFID devices travel through a test region;
   receiving responses from the one or more RFID devices to the RF signal;
   determining a corresponding performance level for the one or more RFID devices based upon a corresponding total count of a plurality of responses of the corresponding one or more RFID devices to the RF signal as the RFID devices move through the test region; and
   storing the performance level corresponding to each of the one or more RFID devices.

22. The method of claim 21, wherein the parameter comprises a field strength that is varied in a non-linear manner as the one or more RFID devices travel through the test region.

23. The method of claim 21, wherein the one or more RFID devices are arranged on a common carrier web.

24. The method of claim 21, further comprising adjusting a performance level threshold for the one or more RFID devices based upon the location of defective RFID devices.

25. The method of claim 21, wherein the test region comprises a plurality of test environments.

26. The method of claim 21, wherein the parameter comprises at least one of a field strength, a direction, a transmission type and a frequency of the RF signal.

27. The method of claim 25, wherein a corresponding parameter is varied in each of the test environments.

* * * * *